United States Patent
Pollard et al.

(10) Patent No.: US 8,906,774 B2
(45) Date of Patent: *Dec. 9, 2014

(54) METHODS AND COMPOSITIONS FOR DOPING SILICON SUBSTRATES WITH MOLECULAR MONOLAYERS

(75) Inventors: Kimberly Dona Pollard, Anderson, IN (US); Allison C. Rector, Indianapolis, IN (US)

(73) Assignee: Dynaloy, LLC, Kingsport, TN (US)

( * ) Notice: Subject to any disclaimer, the term of this patent is extended or adjusted under 35 U.S.C. 154(b) by 125 days.

This patent is subject to a terminal disclaimer.

(21) Appl. No.: 13/042,541

(22) Filed: Mar. 8, 2011

(65) Prior Publication Data
US 2012/0003826 A1 Jan. 5, 2012

Related U.S. Application Data

(60) Provisional application No. 61/311,516, filed on Mar. 8, 2010.

(51) Int. Cl.
*H01L 21/22* (2006.01)
*H01L 21/228* (2006.01)
*H01L 21/225* (2006.01)

(52) U.S. Cl.
CPC .......... *H01L 21/228* (2013.01); *H01L 21/2225* (2013.01); *H01L 21/2254* (2013.01)
USPC .................................. 438/452; 257/E21.135

(58) Field of Classification Search
USPC .................................. 438/542; 257/E21.135
See application file for complete search history.

(56) References Cited

U.S. PATENT DOCUMENTS

| | | | |
|---|---|---|---|
| 3,562,038 A | 2/1971 | Shipley et al. |
| 3,673,099 A | 6/1972 | Corby et al. |
| 4,490,192 A | 12/1984 | Gupta et al. |
| 4,787,997 A | 11/1988 | Saito et al. |
| 5,304,284 A | 4/1994 | Jagannathan et al. |
| 5,308,745 A | 5/1994 | Schwartzkopf |
| 5,417,877 A | 5/1995 | Ward |
| 5,419,779 A | 5/1995 | Ward |

(Continued)

FOREIGN PATENT DOCUMENTS

| | | |
|---|---|---|
| EP | 0 678 571 A | 10/1995 |
| EP | 1 562 225 A | 8/2005 |

(Continued)

OTHER PUBLICATIONS

Ho, et al, Controlled nanoscale doping of semiconductors via molecular monolayers, Nature Materials, vol. 7, Jan. 2008, pp. 62-67.
Ho, et al, Wafer-Scale, Sub-5 nm Junction Formation by Monolayer Doping and Conventional Spike Annealing, 2009, vol. 9, No. 2, pp. 725-730.

(Continued)

*Primary Examiner* — Mary Wilczewski
*Assistant Examiner* — Toniae Thomas
(74) *Attorney, Agent, or Firm* — Dennis V. Carmen

(57) ABSTRACT

Compositions and methods for doping silicon substrates by treating the substrate with a diluted dopant solution comprising tetraethylene glycol dimethyl ether (tetraglyme) and a dopant-containing material and subsequently diffusing the dopant into the surface by rapid thermal annealing. Diethyl-1-propylphosphonate and allylboronic acid pinacol ester are preferred dopant-containing materials, and are preferably included in the diluted dopant solution in an amount ranging from about 1% to about 20%, with a dopant amount of 4% or less being more preferred.

25 Claims, 2 Drawing Sheets

(56) References Cited

U.S. PATENT DOCUMENTS

| | | | |
|---|---|---|---|
| 5,422,309 | A | 6/1995 | Zettler et al. |
| 5,468,423 | A | 11/1995 | Garabedian, Jr. et al. |
| 5,597,678 | A | 1/1997 | Honda et al. |
| 5,612,304 | A | 3/1997 | Honda et al. |
| 5,648,324 | A | 7/1997 | Honda et al. |
| 5,665,845 | A | 9/1997 | Allman |
| 5,795,702 | A | 8/1998 | Tanabe et al. |
| 5,798,323 | A | 8/1998 | Honda et al. |
| 5,840,622 | A | 11/1998 | Miles et al. |
| 5,928,430 | A | 7/1999 | Ward et al. |
| 6,033,996 | A | 3/2000 | Rath et al. |
| 6,200,891 | B1 | 3/2001 | Jagannathan et al. |
| 6,276,372 | B1 | 8/2001 | Lee |
| 6,319,835 | B1 | 11/2001 | Sahbari et al. |
| 6,323,137 | B1 | 11/2001 | Ku et al. |
| 6,372,410 | B1 | 4/2002 | Ikemoto et al. |
| 6,455,479 | B1 | 9/2002 | Sahbari |
| 6,465,403 | B1 | 10/2002 | Skee |
| 6,482,656 | B1 | 11/2002 | Lopatin |
| 6,531,436 | B1 | 3/2003 | Sahbari et al. |
| 6,579,668 | B1 | 6/2003 | Baik et al. |
| 6,638,694 | B2 | 10/2003 | Ikemoto et al. |
| 6,695,903 | B1 | 2/2004 | Kübelbeck et al. |
| 6,777,380 | B2 | 8/2004 | Small et al. |
| 6,825,156 | B2 | 11/2004 | Lee et al. |
| 6,846,748 | B2 | 1/2005 | Chien et al. |
| 6,872,663 | B1 | 3/2005 | Okada |
| 6,878,500 | B2 | 4/2005 | Rutter, Jr. et al. |
| 6,916,772 | B2 | 7/2005 | Zhou et al. |
| 7,049,275 | B2 | 5/2006 | Ikemoto et al. |
| 7,064,087 | B1 | 6/2006 | Turner et al. |
| 7,144,848 | B2 | 12/2006 | Zhou et al. |
| 7,528,098 | B2 | 5/2009 | Lee et al. |
| 7,543,592 | B2 | 6/2009 | Lee |
| 7,579,308 | B2 | 8/2009 | Lee |
| 7,632,796 | B2 | 12/2009 | Phenis et al. |
| 8,097,305 | B2 | 1/2012 | Meyer et al. |
| 8,268,883 | B2 | 9/2012 | Hogg et al. |
| 8,466,035 | B2 * | 6/2013 | Pollard et al. .......... 438/452 |
| 8,748,301 | B2 | 6/2014 | Morita et al. |
| 2001/0014534 | A1 | 8/2001 | Aoki et al. |
| 2002/0037819 | A1 | 3/2002 | Sahbari |
| 2002/0128164 | A1 | 9/2002 | Hara et al. |
| 2002/0152925 | A1 | 10/2002 | Soutar et al. |
| 2003/0130149 | A1 | 7/2003 | Zhou et al. |
| 2003/0181344 | A1 | 9/2003 | Ikemoto et al. |
| 2003/0186175 | A1 | 10/2003 | Ikemoto et al. |
| 2003/0194636 | A1 | 10/2003 | Wanat et al. |
| 2003/0228990 | A1 | 12/2003 | Lee et al. |
| 2004/0038840 | A1 | 2/2004 | Lee et al. |
| 2004/0048761 | A1 | 3/2004 | Ikemoto |
| 2004/0081922 | A1 | 4/2004 | Ikemoto et al. |
| 2004/0134873 | A1 | 7/2004 | Yao et al. |
| 2004/0147420 | A1 | 7/2004 | Zhou et al. |
| 2004/0256358 | A1 | 12/2004 | Shimizu et al. |
| 2005/0016961 | A1 | 1/2005 | Toda et al. |
| 2005/0090416 | A1 | 4/2005 | Lee et al. |
| 2005/0176259 | A1 | 8/2005 | Yokoi et al. |
| 2005/0202987 | A1 | 9/2005 | Small et al. |
| 2005/0263743 | A1 | 12/2005 | Lee |
| 2006/0003910 | A1 | 1/2006 | Hsu et al. |
| 2006/0014656 | A1 | 1/2006 | Egbe et al. |
| 2006/0046446 | A1 | 3/2006 | Kon et al. |
| 2006/0073997 | A1 | 4/2006 | Leonte et al. |
| 2006/0094613 | A1 | 5/2006 | Lee |
| 2006/0099831 | A1 | 5/2006 | Borovik et al. |
| 2006/0138399 | A1 | 6/2006 | Itano et al. |
| 2007/0099805 | A1 | 5/2007 | Phenis et al. |
| 2007/0111912 | A1 | 5/2007 | Phenis et al. |
| 2007/0149430 | A1 | 6/2007 | Egbe et al. |
| 2007/0243773 | A1 | 10/2007 | Phenis et al. |
| 2008/0011714 | A1 | 1/2008 | Yokoi et al. |
| 2008/0070404 | A1 | 3/2008 | Beck et al. |
| 2008/0076688 | A1 | 3/2008 | Barnes et al. |
| 2008/0122005 | A1 | 5/2008 | Horsky et al. |
| 2008/0261847 | A1 | 10/2008 | Visintin et al. |
| 2009/0186793 | A1 | 7/2009 | Phenis et al. |
| 2009/0286349 | A1 | 11/2009 | Rohatgi et al. |
| 2010/0056409 | A1 | 3/2010 | Walker et al. |
| 2010/0104824 | A1 | 4/2010 | Phenis et al. |
| 2010/0112728 | A1 | 5/2010 | Korzenski et al. |
| 2011/0081742 | A1 | 4/2011 | Barr et al. |
| 2011/0124187 | A1 | 5/2011 | Afzali-Ardakani et al. |
| 2011/0186969 | A1 | 8/2011 | Afzali-Ardakani et al. |
| 2012/0160306 | A1 | 6/2012 | Hirai et al. |
| 2013/0260545 | A1 | 10/2013 | Pollard et al. |
| 2014/0124896 | A1 | 5/2014 | Hochstetler et al. |

FOREIGN PATENT DOCUMENTS

| | | |
|---|---|---|
| EP | 1 736 534 A1 | 12/2006 |
| JP | 62-188785 A | 8/1987 |
| JP | 2005 123431 A | 5/2005 |
| SU | 1 807 077 A1 | 4/1993 |
| WO | 01/14250 | 3/2001 |
| WO | 03 083920 A | 10/2003 |
| WO | 2011/112546 A1 | 9/2011 |

OTHER PUBLICATIONS

International Search Report from PCT/US11/27493, mailed May 13, 2011.

Ho et al., Wafer-Scale, Sub-5 nm Junction Formation by Monolayer Doping and Conventional Spike Annealing, Nano Letters, 2009, vol. 9, No. 2, pp. 725-730, entire document, especially: p. 726, col. 1, para. 2.

Ho et al., Controlled Nanoscale Doping of Semiconductors via Molecular Monolayers, Nature Materials, vol. 7, Jan. 2008, pp. 62-67, entire document.

"Resorcinol CAS# 108-46-3", IS Chemical Technology, 2010.

Database WPI Week 199424, Derwent Publications Ltd., London.

Notification of Transmittal of the International Search Report dated Jun. 5, 2008 for corresponding PCT/US2006/041394.

Notification of Transmittal of the International Search Report dated Feb. 21, 2008 for corresponding PCT/US2007/066128.

Notification of Transmittal of the International Search Report dated Jan. 12, 2009 for corresponding PCT/US2008/071485.

Written opinion of the International Searching Authority dated Jan. 12, 2009 for corresponding PCT/US2008/071485.

Written opinion of the International Searching Authority dated Feb. 21, 2008 for corresponding PCT/US2007/066128.

Written opinion of the International Searching Authority dated Nov. 25, 2009 for corresponding PCT/US2009/048409.

Notification of Transmittal of the International Search Report dated Nov. 25, 2009 for corresponding PCT/US2009/048409.

Related U.S. Appl. No. 60/953,804 filed Aug. 3, 2007.

Related U.S. Appl. No. 61/075,195 filed Jun. 24, 2008.

Related U.S. Appl. No. 61/557,229 filed Nov. 8, 2011.

Non-Final Office Action mailed Dec. 15, 2008 for related U.S. Appl. No. 11/260,912.

Notice of Allowance mailed Aug. 28, 2009 for related U.S. Appl. No. 11/260,912.

Non-Final Office Action mailed Jun. 17, 2010 for related U.S. Appl. No. 11/551,826.

Non-Final Office Action mailed Aug. 25, 2011 for related U.S. Appl. No. 11/551,826.

Non-Final Office Action mailed Jul. 19, 2011 for related U.S. Appl. No. 12/637,828.

Non-Final Office Action mailed Apr. 3, 2009 for related U.S. Appl. No. 11/928,754.

Non-Final Office Action mailed Mar. 22, 2010 for related U.S. Appl. No. 12/697,470.

Non-Final Office Action mailed Aug. 17, 2011 for related U.S. Appl. No. 12/490,654.

Non-Final Office Action mailed Feb. 9, 2012 for related U.S. Appl. No. 12/490,654.

Notice of Allowance mailed Nov. 17, 2011 for related U.S. Appl. No. 12/637,828.

(56) References Cited

OTHER PUBLICATIONS

Notice of Allowance mailed Sep. 30, 2009 for related U.S. Appl. No. 11/928,754.
Notice of Allowance mailed Aug. 23, 2010 for related U.S. Appl No. 12/697,470.
Notice of Allowance mailed Jan. 25, 2012 for related U.S. Appl. No. 11/551,826.
Notice of Allowance mailed Mar. 1, 2012 for related U.S. Appl. No. 11/551,826.
Related U.S. Appl. No. 11/260,912 filed Oct. 28, 2005.
Related U.S. Appl. No. 11/551,826 filed Oct. 23, 2006.
Related U.S. Appl. No. 12/091,808 filed Oct. 24, 2006.
Related U.S. Appl. No. 12/637,828 filed Dec. 15, 2009.
Related U.S. Appl. No. 11/928,754 filed Oct. 30, 2007.
Related U.S. Appl. No. 12/697,470 filed Feb. 1, 2010.
Related U.S. Appl. No. 12/490,654 filed Jun. 24, 2009.
USPTO Office Action dated Sep. 13, 2013 in co-pending U.S. Appl. No. 13/875,566.
Ho, Johnny C., et al.; "Controlled Nanoscale Doping of Semiconductors via Molecular Monolayers"; Supporting Information; Nature Materials, vol. 7, issue 1, (2007), 10 pages.
Sieval, Alexander B., et al.; An Improved Method for the Preparation of Organic Monolayers of 1-Alkenes on Hydrogen-Terminated Silicon Surfaces; Langmuir 1999, vol. 15, pp. 8288-8291.
Leftwich, Timothy R., et al.; "Chemical manipulation of multifunctional hydrocarbons on silicon surfaces"; Surface Science Reports 63, (2008), pp. 1-71.
Tapia-Benavides, Antonio R., et al.; "Do Spiroarsoranes Exhibit Polytopal Equilibrium in Solution?", lnorg. Chem. 2010, 49, pp. 1496-1502.
Dale, Arild J., et al.; "The Preparation and Dynamic Stereochemistry of Oxyarsoranes Containing Five- and Six-membered Ring Systems", Acta Chemica Scandinavica B 29, (1975), pp. 741-748.
Loiseau, P.M., et al.; "Design, Synthesis and Biological Study of New Antiparasitic Spiroarsoranes"; Arzneim.-Forsch./ Drug Res. 43 (II), Nr. 9, (1993), pp. 1004-1009.
Betz, Richard, et al.; "From Simple Diols to Carbohydrate Derivatives of Phenylarsonic Acid"; Inorganic Chemistry 2009, 48, pp. 925-935.
Sieval, A.B., et al.; "Highly Stable Si-C Linked Functionalized Monolayers on the Silicon (100) Surface"; Langmuir, 1998, 14, 1759-1768.
Scheres, Luc, et al.; "Organic Monolayers onto Oxide-Free Silicon and Improved Surface Coverage: Alkynes versus Alkenes"; Langmuir, 2010, 26(7), 4790-4795.
Boukherroub, Rabah, et al.; Insights into the Formation Mechanisms of Si-OR Monolayers from the Thermal Reactions of Alcohols and Aldehydes with Si(111)-H[1]; Langmuir, 2000, 16, 7429-7434.
Sauer, D.E., et al.; "Ultrahigh vacuum surface analysis of silicon (100) treated in aqueous hydrofluoric acid and buffered hydrofluoric acid solutions"; Applied Surface Science, 78, (1994), 47-55.
Lafranzo, Natalie a., et al.; "Arsonic Acid Self-Assembled Monolayers Protect Oxide Surfaces from Micronewton Nanomechanical Forces"; Adv. Funct. Mater., 2013, 23, 2415-2421.
Becker, Frank S., et al.; "Low Pressure Deposition of Doped Si02 by Pyrolysis of Tetraethylorthosilicate (TEOS) II. Arsenic Doped Film"; J. Electrochem. Soc., vol. 136, No. 10, Oct. 1989, 3033-3043.
Baer, Carl D., et al.; "Kinetics of the Hydrolysis of Arsenate(V) Triesters"; lnorg. Chem., 1981, 20, 905-907.
Kuhn, B., et al.; "Versuche zur quantitativen Bestimmung des Arsens nach dem Marsh'schen Verfahreh. Verhalten des Arsenwasserstoffes zu Aktzkali"; Berichte der Deutchen Chemischen Gesellschaft, 23, 1798-1803.
Musil, Stanislav, et al.; "Speciation without Chromatography using Selective Hydride Generation: Inorganic Arsenic in Rice and Samples of Marine Origin"; Analytical Chemistry, 2014, 86, 993-999.
Longo, Robert C., et al.; "Monolayer Doping via Phosphonic Acid Grafting on Silicon: Microscopic Insight from Infrared Spectroscopy and Density Functional Theory Calculations"; Adv. Funct. Mater., 2013, 23, 3471-3477.
Thissen, Peter, et al.; "Activation of Surface Hydroxyl Groups by Modification of H-Terminated Si(111) Surfaces"; J. Am. Chem. Soc., 2012, 134, 8869-8874.

Voorthuijzen, W. Pim, et al.; "Local Doping of Silicon Using Nanoimprint Lithography and Molecular Monolayers"; Advanced Materials, 2011, 23, 1346-1350.
USPTO Notice of Allowance dated Jul. 14, 2014 in co-pending U.S. Appl. No. 13/669,087.
Ho, Johnny C., et al.; "Controlled Nanoscale Doping of Semiconductors via Molecular Monolayers"; Supporting Information; Nature Materials, vol. 7, issue 1, (2007), 10 pages, (2007).
Sieval, Alexander B., et al.; An Improved Method for the Preparation of Organic Monolayers of 1-Alkenes on Hydrogen-Terminated Silicon Surfaces; Langmuir 1999, vol. 15, pp. 8288-8291, (1999).
Leftwich, Timothy R., et al.; "Chemical manipulation of multifunctional hydrocarbons on silicon surfaces"; Surface Science Reports 63, (2008), pp. 1-71, (2008).
Tapia-Benavides, Antonio R., et al.; "Do Spiroarsoranes Exhibit Polytopal Equilibrium in Solution?", lnorg. Chem. 2010, 49, pp. 1496-1502, (2010).
Dale, Arild J., et al.; "The Preparation and Dynamic Stereochemistry of Oxyarsoranes Containing Five- and Six-membered Ring Systems", Acta Chemica Scandinavica B 29, (1975), pp. 741-748, (1975).
Loiseau, P.M., et al.; "Design, Synthesis and Biological Study of New Antiparasitic Spiroarsoranes"; Arzneim.-Forsch./ Drug Res. 43 (II), Nr. 9, (1993), pp. 1004-1009, (1993).
Betz, Richard, et al.; "From Simple Diols to Carbohydrate Derivatives of Phenylarsonic Acid"; Inorganic Chemistry 2009, 48, pp. 925-935, (2009).
International Search Report and Written Opinion with date of mailing Apr. 24, 2014 for International Application No. PCT/US2013/068426.
Co-pending U.S. Appl. No. 14/272,482 filed May 7, 2014, Monika Karin Wiedmann et al.
Ho, Johnny C., et al.; "Nanoscale doping of InAs via sulfur monolayers"; Applied Physics Letters, 95, 072108 (2009).
Sieval, A.B., et al.; "Highly Stable Si-C Linked Functionalized Monolayers on the Silicon (100) Surface"; Langmuir, 1998, 14, 1759-1768, (1998).
Scheres, Luc, et al.; "Organic Monolayers onto Oxide-Free Silicon and Improved Surface Coverage: Alkynes versus Alkenes"; Langmuir, 2010, 26(7), 4790-4795, (2010).
Boukherroub, Rabah, et al.; Insights into the Formation Mechanisms of Si-OR Monolayers from the Thermal Reactions of Alcohols and Aldehydes with Si(111)-H[1]; Langmuir, 2000, 16, 7429-7434, (2000).
Sauer, D.E., et al.; "Ultrahigh vacuum surface analysis of silicon (100) treated in aqueous hydrofluoric acid and buffered hydrofluoric acid solutions"; Applied Surface Science, 78, (1994), 47-55, (1994).
Lafranzo, Natalie A., et al.; "Arsonic Acid Self-Assembled Monolayers Protect Oxide Surfaces from Micronewton Nanomechanical Forces"; Adv. Funct. Mater., 2013, 23, 2415-2421, (2013).
Becker, Frank S., et al.; "Low Pressure Deposition of Doped SiO$_2$ by Pyrolysis of Tetraethylorthosilicate (TEOS) II. Arsenic Doped Film"; J. Electrochem. Soc., vol. 136, No. 10, Oct. 1989, 3033-3043, (Oct. 10, 1989).
Baer, Carl D., et al.; "Kinetics of the Hydrolysis of Arsenate(V) Triesters"; Inorg. Chem., 1981, 20, 905-907, (1981).
Kuhn, B., et al.; "Versuche zur quantitativen Bestimmung des Arsens nach dem Marsh'schen Verfahreh. Verhalten des Arsenwasserstoffes zu Aktzkali"; Berichte der Deutchen Chemischen Gesellschaft, 23, 1798-1803.
Musil, Stanislav, et al.; "Speciation without Chromatography using Selective Hydride Generation: Inorganic Arsenic in Rice and Samples of Marine Origin"; Analytical Chemistry, 2014, 86, 993-999, (Dec. 19, 2013).
Longo, Robert C., et al.; "Monolayer Doping via Phosphonic Acid Grafting on Silicon: Microscopic Insight from Infrared Spectroscopy and Density Functional Theory Calculations"; Adv. Funct. Mater., 2013, 23, 3471-3477, (2013).
Thissen, Peter, et al.; "Activation of Surface Hydroxyl Groups by Modification of H-Terminated Si(111) Surfaces"; J. Am. Chem. Soc., 2012, 134, 8869-8874, (May 3, 2012).
USPTO Notice of Allowance dated Aug. 4, 2014 in co-pending U.S. Appl. No. 13/875,566.
USPTO Notice of Allowance dated Aug. 15, 2014 in co-pending U.S. Appl. No. 13/669,087.

* cited by examiner

METHODS AND COMPOSITIONS FOR DOPING SILICON SUBSTRATES WITH MOLECULAR MONOLAYERS

This application claims priority from U.S. Provisional Patent Application No. 61/311,516, filed Mar. 8, 2010, the entire contents of which is hereby incorporated herein by reference.

FIELD OF THE INVENTION

The present invention relates generally to methods for doping a Si surface, and more particularly to methods for doping a Si surface by treating the substrate with a dopant solution and subsequently diffusing the dopant into the surface by rapid thermal annealing.

BACKGROUND OF THE INVENTION

Decreasing device size has been the main driving force for technology advancements in the semiconductor industry over the last several decades. For example, in front end of line (FEOL) applications in semiconductor processing, junction depths have been scaled continuously together with the gate lengths in order to achieve faster transistor speeds and higher packing densities. Typically, source/drain extension junction depths of about one third of the transistor gate length have been used for efficient electrostatics and acceptable leakage currents. With gate lengths fast approaching the sub-10 nm regimes, development work is focused on reliably making sub-5 nm ultrashallow junctions (USJs) with low sheet resistivity to facilitate the future scaling of transistors.

Most commonly, USJs are commercially fabricated by the combination of ion implantation and spike annealing. During the process, Si atoms are displaced by energetic dopant ions and a subsequent annealing step (e.g. spike, a high temperature anneal process of less than 1 s with fast temperature ramp up/down capability) is used to activate the dopants by moving them into the appropriate lattice positions and restoring the substrate's crystal quality. Unfortunately, point defects such as Si interstitials and vacancies are also generated, which interact with the dopants to further broaden the junction profile—called transient-enhanced diffusion (TED), which limits the formation for sub-10 nm USJs by conventional technologies.

Significant research efforts have been made to develop new strategies to manufacture <5 nm USJs which utilize heavier implantation dopant sources (molecular implantation, gas cluster ion beam, and plasma doping) to obtain shallower doping profiles, and advanced annealing techniques (flash and laser) to activate the implanted dopants without causing significant diffusion. However, problems relating to the effects of advanced doping and annealing techniques on junction uniformity, reliability and subsequent process integration continue to hamper their use in IC manufacturing.

One potential route for achieving the USJs, while maintaining controlled doping of semiconductor materials with atomic accuracy, at such small scales, takes advantage of the crystalline nature of silicon and its rich, self-limiting surface reaction properties. This method relies on the formation of self-assembled monolayers of dopant-containing molecules on the surface of crystalline Si followed by the subsequent thermal diffusion of dopant atoms via rapid thermal annealing (RTA).

Ground-breaking work in this area has been performed by Professor Ali Javey at Berkeley (Nature Materials, vol. 7, January 2008, pp 62-67; Nanoletters, 2009 Vol. 9, No 2, pp 725-730). Dr. Javey and his group successfully doped silicon wafers by treating the Si surfaces with a dopant dissolved in mesitylene (the dopant being allylboronic acid pinacol ester for p-doped wafers, and diethyl-1-propylphosphonate for n-doped wafers), and subsequently annealing the material to diffuse the dopant atoms into the surface and achieve the n+/p USJs. Dr. Javey's results were confirmed by SIMS, and penetration depth for P-containing mixtures were observed to be ~3-3.5 nm.

Problems remain to be solved with the Javey process though. For example, the mesitylene-containing treatment solutions used by Dr. Javey are not appropriate for commercial applications where high surface modification reaction temperatures are employed and commercial-scale material handling considerations are important. Accordingly, a need remains for improvements to Dr. Javey's method for doping silicon substrates. The present invention addresses that need.

SUMMARY OF THE INVENTION

In one preferred embodiment of the present invention there is provided a method for doping a Si surface comprising treating the substrate with a diluted dopant solution comprising tetraethylene glycol dimethyl ether (tetraglyme) and a dopant-containing material and subsequently diffusing the dopant into the surface. Dithyl-1-propylphosphonate and allylboronic acid pinacol ester are preferred dopant-containing materials, and are preferably included in the diluted dopant solution in an amount ranging from about 1% to about 20%, with a dopant amount of 4% or less being more preferred. A capping layer is preferably applied prior to diffusion, such as by depositing silicon oxide or silicon nitride. A diffusion step is preferably accomplished by rapid thermal annealing.

DESCRIPTION OF THE PREFERRED EMBODIMENTS

Figure 1:
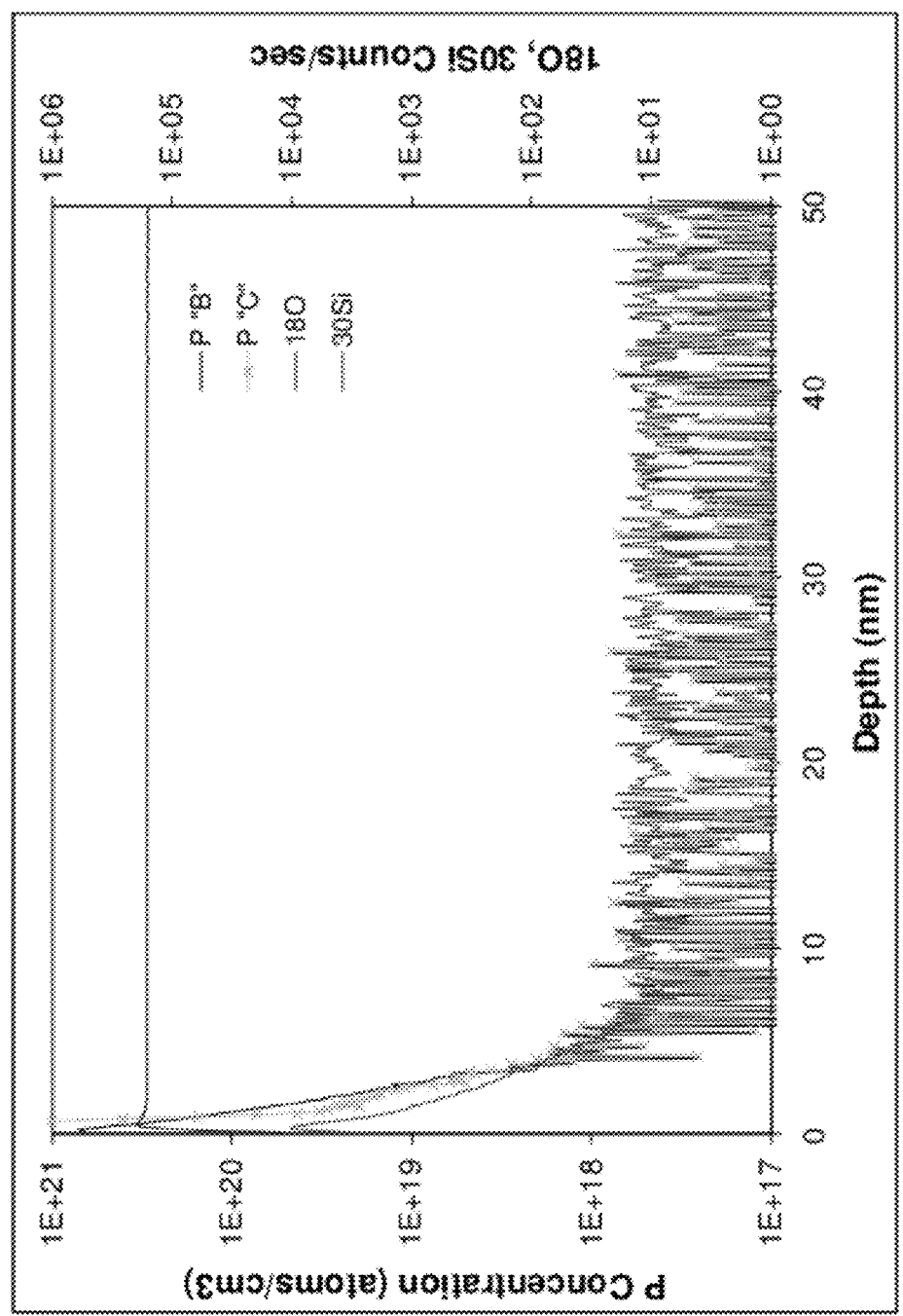
FIG. 1 is a table showing the penetration depth of phosphorus atoms or boron atoms into the silicon substrate.

For the purposes of promoting an understanding of the principles of the invention, reference will now be made to certain embodiments and specific language will be used to describe the same. It will nevertheless be understood that no limitation of the scope of the invention is thereby intended, such alterations and further modifications of the illustrated embodiments being contemplated as would normally occur to one skilled in the art to which the invention relates.

In one aspect of the present invention there is provided a method for doping a Si surface by treating the substrate with a diluted dopant solution comprising tetraethylene glycol dimethyl ether (tetraglyme) and a dopant-containing material and subsequently diffusing the dopant into the surface.

In the preferred embodiments the Si surface is initially cleaned to remove oxides and provide an H-terminated silicon surface. The initial cleaning may be accomplished using dilute HF, for example. Additional steps may also be employed to protect the surface until the tetraglyme-dopant treatment, such as treating the surface with 3-methyl-3-methoxybutanol.

In one preferred aspect of the present invention tetraethylene glycol dimethyl ether (tetraglyme) is used as a solvent to provide a dopant-containing material to the cleaned Si substrate. The solvent interacts with the dopant molecules, carrying them to the silicon surface and thereby allows control of the amount of dopant that is applied to the surface.

The tetraglyme is preferably included in an amount appropriate to dilute the dopant material to an amount less than 20% and preferably no more than 4%. If no additional solvents are used the amount of tetraglyme may be 80% or more, and preferably 96% or more. If additional solvents are used the amount of tetraglyme may be correspondingly less.

In another embodiment the solvent system comprises a solvent instead of or in addition to tetraglyme. Preferred additional or alternative solvents have individual flash points above 120° C., or provide a solvent system having a combined flash point above 120° C. Preferred additional or alternative solvents also have a contact angle of 0° when applied to a Si surface, and are miscible with water. In other embodiments the additional or alternative solvent has those characteristics and is a polar solvent.

The secondary solvent that may replace or be used in addition to tetraglyme may include one or more of the following: dimethylsulfoxide (DMSO), dimethylsulfone, N-methylpyrrolidone (NMP), 1 formyl piperidine, other gycol ethers such as triglyme or diglyme, isopar solvent blends such as Isopar M, alkanolamines such as ethanolamine, diethanolamine, triethanolamine, fatty acids such as linoleic acid, oleic acid, palmitoleic acid, and mixtures of fatty acids in such solvents as safflower oil, grape seed oil, poppyseed oil, sunflower oil, hemp oil, corn oil, wheat germ oil, cottonseed oil, soybean oil, walnut oil, sesame oil, rice bran oil, pistachio oil, peanut oil, canola oil, chicken fat, egg yolk, linseed oil, lard, olive oil, palm oil, cocoa butter, macadamia oil, butter, and coconut oil As to the dopant, diethyl-1-propylphosphonate and allylboronic acid pinacol ester are preferred dopant-containing materials. In some embodiments other dopants effective for producing n-doped or p-doped surfaces may be used in addition to or instead of diethyl-1-propylphosphonate and/or allylboronic acid pinacol ester. For example, arsenic or another Group V material may be used in addition to or in place of phosphorus, and galium or another Group III material may be used in addition to or in place of boron.

In other embodiments the dopant comprises 5-5 Dimethyl-1,3,2-dioxaphosphorinan-2-one. In another embodiment the dopant comprises triphenylphosphate. In another embodiment the dopant comprises trimethylphosphite. In another embodiment the dopant comprises diethyl ethylphosphonate. In another embodiment the dopant comprises dimethyl methylphosphonate. In another embodiment the dopant comprises diethyl (2-oxobutyl) phosphonate. In another embodiment the dopant comprises diethyl (hydroxymethyl)phosphonate. In another embodiment the dopant comprises dimethyl (3-phenoxyacetonyl)phosphonate. In another embodiment the dopant comprises bis(4-methoxyphenyl)phosphine. In another embodiment the dopant comprises bis(3,5-dimethylphenyl)phosphine. In another embodiment the dopant comprises diethyl (2-oxopropyl)phosphonate. In another embodiment the dopant comprises diethyl 1-phenylethyl phosphonate. In another embodiment the dopant comprises diethyl 2-phenylethyl phosphonate. In another embodiment the dopant comprises diethyl cyclopropylmethyl phosphonate. In another embodiment the dopant comprises dimethyl (3-phenoxyacetonyl)phosphonate. In another embodiment the dopant comprises diethyl (2-methylallyl)phosphonate. In another embodiment the dopant comprises one or more members selected from the group consisting of 5-5 Dimethyl-1,3,2-dioxaphosphorinan-2-one, triphenylphosphate, trimethylphosphite, diethyl ethylphosphonate, dimethyl methylphosphonate, diethyl (2-oxobutyl) phosphonate, diethyl (hydroxymethyl)phosphonate, dimethyl (3-phenoxyacetonyl)phosphonate, bis(4-methoxyphenyl)phosphine, bis (3,5-dimethylphenyl)phosphine, diethyl (2-oxopropyl)phosphonate, diethyl 1-phenylethyl phosphonate, diethyl 2-phenylethyl phosphonate, diethyl cyclopropylmethyl phosphonate, dimethyl (3-phenoxyacetonyl)phosphonate, diethyl (2-methylallyl)phosphonate, and Diethyl-1-propylphosphonate.

The dopant material is preferably included in the diluted dopant solution in an amount ranging from about 1% to about 20%, with a dopant amount of 1% to 10% being more preferred, and a doping amount of 4% or less being most preferred in testing to date.

A capping layer is preferably applied prior to diffusion, such as by depositing silicon oxide or silicon nitride. In one embodiment a 50 nm thick capping layer is applied by plasma enhanced chemical vapor deposition (PECVD) prior to diffusion.

The dopant material is diffused into the Si surface by annealing after the deposition of a capping layer. Preferably, rapid thermal annealing (RTA) is used.

Reference will now be made to specific examples using the processes described above. It is to be understood that the examples are provided to more completely describe preferred embodiments, and that no limitation to the scope of the invention is intended thereby.

Example 1

Solubility Testing

A variety of solvents were evaluated as potential replacements for mesitylene in allylboronic acid pinacol ester:mesitylene and diethylpropyl-phosphonate:mesitylene systems. The candidate solvents included: 1) Dimethylsulfoxide (DMSO); 2) N-methylpyrrolidone (NMP); 3) 1-formyl piperidine (1-FP); 4) tetraglyme, (TG); and 5) Isopar M (IM).

Solubility was tested with diethyl 1-propylphoshonate 97% (n-type dopant) and allylboronic acid pinacol ester (p-type dopant). Solvent to additive ratio (n or p type) material is 1:4. Solubility results are provided below:

| Solvent and Diethyl 1-propylphoshonate | Solubility observations after 12 hrs, @ 23° C. |
|---|---|
| DMSO | Clear, stayed in sol'n |
| NMP | Clear, stayed in sol'n |
| 1-FP | Clear, stayed in sol'n |
| TG | Clear, stayed in sol'n |
| IM | Clear, stayed in sol'n |

| Solvent and Allyboronic acid pinacol ester | Solubility observations after 12 hrs, @ 23° C. |
|---|---|
| DMSO | Slightly cloudy, stayed in sol'n |
| NMP | Slightly cloudy, stayed in sol'n |
| 1-FP | Clear, stayed in sol'n |
| TG | Clear, stayed in sol'n |
| IM | Clear, stayed in sol'n |

All of the materials were soluble and stayed in solution. They were checked after 12 hours, having been maintained at room temperature.

Example 2

Contact Angle Testing

Contact angle testing was also conducted. Silicon substrates (n-doped and p-doped prior to testing) were submerged in 0.5% HF(aq) for 2 minutes at room temperature (23° C.) before testing contact angles. DI water and mesitylene were used as references.

The observed contact angles on Si (100) n-type and p-type are reported below:

| Solvent and Diethyl 1-propylphoshonate | Substrate | Contact Angle |
|---|---|---|
| Mesitylene | n-doped Si | No reading = 0 |
|  | p-doped Si | No reading = 0 |
| DMSO | n-doped Si | No reading = 0 |
|  | p-doped Si | Avg. = 22.57° |
| NMP | n-doped Si | No reading = 0 |
|  | p-doped Si | No reading = 0 |
| 1-Formyl Piperidine | n-doped Si | No reading = 0 |
|  | p-doped Si | No reading = 0 |
| Tetraglyme | n-doped Si | No reading = 0 |
|  | p-doped Si | No reading = 0 |
| Isopar M | n-doped Si | No reading = 0 |
|  | p-doped Si | No reading = 0 |

| Solvent and Allylboronic acid pinacol ester | Substrate | Contact Angle |
|---|---|---|
| Mesitylene | n-doped Si | No reading = 0 |
|  | p-doped Si | No reading = 0 |
| DMSO | n-doped Si | No reading = 0 |
|  | p-doped Si | No reading = 0 |
| NMP | n-doped Si | No reading = 0 |
|  | p-doped Si | No reading = 0 |
| 1-FP | n-doped Si | No reading = 0 |
|  | p-doped Si | No reading = 0 |
| TG | n-doped Si | No reading = 0 |
|  | p-doped Si | No reading = 0 |
| IM | n-doped Si | No reading = 0 |
|  | p-doped Si | No reading = 0 |

|  | Substrate | Contact Angle |
|---|---|---|
| DI water | n-doped Si | Avg. = 78.89° |
|  | p-doped Si | Avg. = 73.52° |

The contact angle testing indicated that all of the tested solvents other than DMSO have no contact angle and therefore wet the surface of the substrate. Given the contact angle measurement for DMSO, it was excluded from further testing.

Example 3

Phosphorus Doping

Diluted dopant solutions were used to dope a Si substrate. The following glassware was used for the doping testing: 3 neck round bottom flask (500 mL), 2 distilling columns, stainless steel tube for $N_2$ inlet, 2 thermometer adaptors, Y distillation adaptor, 4 tubes for columns and $N_2$, circulation bath, thermometer, heating mantel.

The following materials were used: $N_2$ (ultra high purity), Ethylene Glycol/water mixture (1:1), experimental solution (solutions used are listed below), 3-methyoxy-3-methylbutanol, 0.5% HF solution, IPA, n-type Si substrate, p-type Si substrate.

The test procedure was as follows:
1. Set up the glassware, reflux bath (ethylene glycol and DI 1:1), place round bottom flask on heating mantel, cleave Si substrate into small pieces about 1½ cm×1½ cm for testing. Both n- and p-type substrates were processed at the same time.
2. Prepare Solutions:
   HF (0.5% in solution)
   3-methoxy-3-methylbutanol
   Experimental solution:
      Solution #1—TG and diethyl 1-propylphonate 4:1 (v/v)—20 g total in flask
      Solution #2—1-FP and diethyl 1-propylphonate 4:1 (v/v)—20 g total in flask
      Solution #3—TG and allylboronic acid pinacol ester 4:1 (v/v)—20 g total in flask
      Solution #4—1-FP and allylboronic acid pinacol ester 4:1 (v/v)—20 g total in flask
3. Purge the round bottom flask containing the desired solution with $N_2$, bubbling the $N_2$ though the fluid for an hour at room temperature.
4. Heat solution to 120° C. using the heating mantel, start the cooling liquid flow (~10° C.) through the condenser while heating and continue its flow throughout the doping process.
5. Once the solution is at 120° C., prepare substrates by processing them in room temperature solutions of HF (2 min) and then 3-methoxy-3-methylbutanol (30 s).
6. Immediately after step 5, place the treated substrates in a round bottom flask containing heated dilute doping solution for 2.5 h at 120° C., and continue the $N_2$ bubbling.
7. After 2.5 hours, cool the glassware apparatus and solution for 15 to 20 minutes, with the cooling water still running through the condenser before removing the pieces.
8. Rinse pieces in IPA after removing from the solution.
9. Deposit silicon oxide or silicon nitride or other appropriate capping material, such as plasma enhanced tetraethylorthosilicate (PETEOS).
10. Carry out a high temperature anneal process (1050° C. anneal), and characterize by Secondary Ion Mass Spectrometry (SIMS).

SIMS is an analytical technique that detects very low concentrations of dopants and impurities. It can provide elemental depth profiles over a depth range from a few angstroms to tens of microns. SIMS works by sputtering the sample surface with a beam of primary ions. Secondary ions formed during the sputtering are extracted and analyzed using a mass spectrometer. These secondary ions can range from matrix levels down to sub-parts-per-million trace levels. This technique was used to determine if phosphorus atoms (from diethyl 1-propylphosphonate) or boron atoms (from allylboronic acid pinacol ester) penetrated into the silicon substrate after the capping and high temperature annealing processes. Results are shown in FIG. 1. The x-axis indicates the depth of penetration of each atom type that was monitored (and is indicated on the graph's legend)

In the FIG. 1 example, one sample was created using mesitylene as the solvent, and one was prepared using tetraglyme (TG) as the solvent. The samples were compared using SIMS to generate data for the comparison. The system using tetraglyme as the solvent provided phosphorus to the surface and, after capping and annealing, allowed the phosphorus to penetrate the Si deeper than the phosphorus provided to the silicon surface by the mesitylene solvent system.

Figure 2:
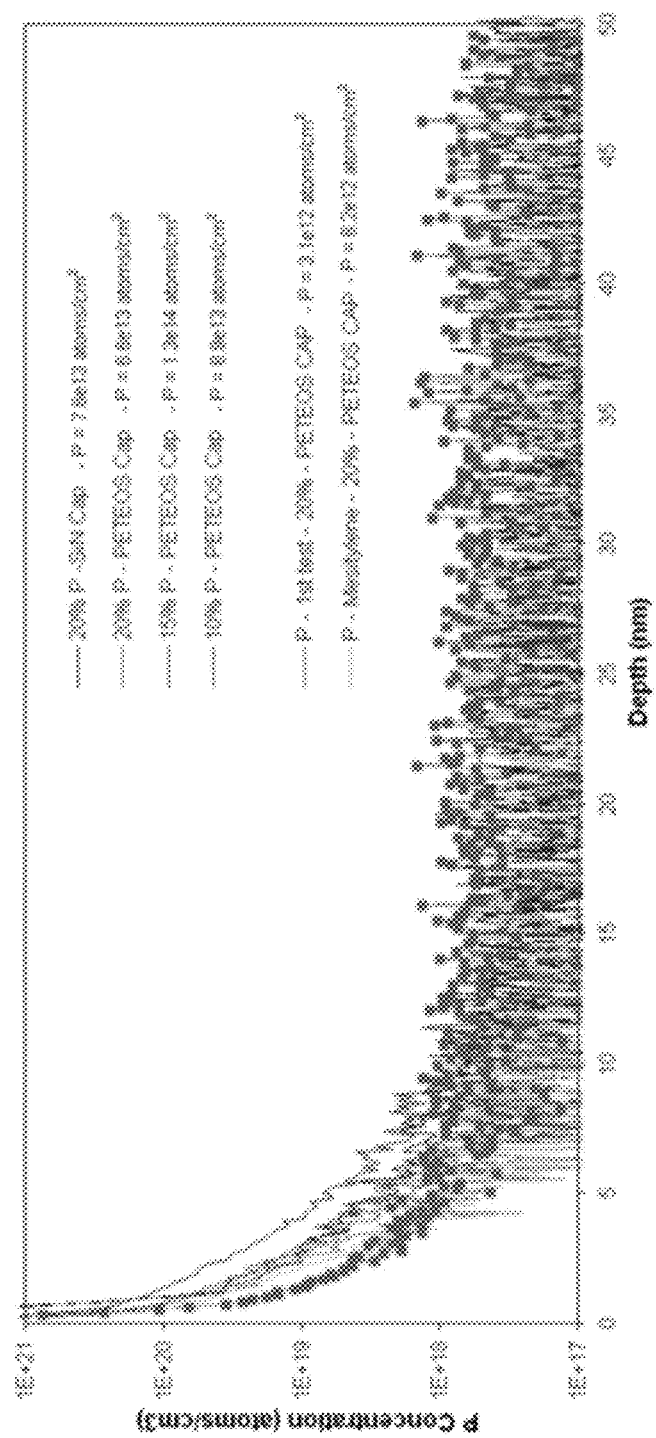
FIG. 2 is a table depicting the SIMS results after multiple loadings of diethyl-1-propylphosphonate in the solution.

Additional SIMS results after multiple loadings of diethyl 1-propylphoshonate in the solution are provided in FIG. 2.

The results for the phosphorus doped samples indicate that doping depth can be controlled by one or a combination of factors such as doping concentration, time, and temperature.

Example 4

Representative Production Process

The doped surfaces of the present invention may be produced by the following process:
1. Clean and dry a patterned Si wafer, preferably using DHF solution;
2. Clean immersion tank;
3. Rinse cleaned tank with tetraglyme or doping solution multiple times until all the solution that was used for cleaning is purged;
4. Fill tank with doping solution to a level great enough to completely cover the wafers to be doped;
5. Heat the doping solution to the temperature required to create a layer of dopant on the silicon;
6. Completely immerse the wafers in the doping solution for time required to create a layer of dopant on the silicon;
7. Rinse wafers with appropriate solvent (for example, IPA or $H_2O$); and
8. Dry the wafers with $N_2$.

Subsequent to the above, the doped surfaces may be treated as follows:
1. Oxide deposition; and
2. Annealing to promote dopant diffusion.

Appropriate process steps for capping the doped surface (oxide deposition) and for annealing to promote dopant diffusion may be accomplished using methods known to persons skilled to the art.

While the compositions and methods of the present invention have been described by reference to certain preferred embodiments, it will be apparent to those of skill in the art that variations may be applied to the compositions and methods described herein without departing from the concept and spirit of the invention. All such modifications apparent to those skilled in the art are desired to be protected, and are deemed to be within the scope of the invention as herein disclosed and claimed.

What is claimed is:

1. A method of preparing a doped Si surface, comprising:
a) cleaning a Si surface to remove oxides; and
b) contacting the cleaned Si surface with a dilute dopant solution comprising tetraethylene glycol dimethyl ether (tetraglyme) and a dopant material effective for doping a Si surface, wherein said contacting is for a time and at a temperature effective to form a layer of dopant material on the surface.

2. The method of claim 1 wherein the method further includes the step of applying a capping layer to the doped area.

3. The method of claim 2 wherein the method further includes the step of diffusing the dopant into the Si surface by annealing the treated Si substrate.

4. A method of doping a Si surface, comprising:
a) cleaning a Si surface to remove oxides;
b) contacting the cleaned Si surface with a dilute dopant solution comprising tetraethylene glycol dimethyl ether (tetraglyme) and a dopant material effective for doping a Si surface, wherein said contacting is for a time and at a temperature effective to form a layer of dopant material on the surface;
(c) applying a capping layer to the doped area; and
d) diffusing the dopant into the Si surface by annealing the treated Si substrate.

5. The method of claim 1 wherein said cleaning step comprises contacting the Si surface with dilute HF.

6. The method of claim 1 wherein the method additionally includes the step of treating the cleaned Si surface with 3-methyl-3-methoxybutanol prior to contacting with the dilute dopant solution.

7. The method of claim 1 wherein said dopant material is provided in an amount of between 1% and 20%.

8. The method of claim 1 wherein said dopant material is provided in an amount of 4% or less.

9. The method of claim 1 wherein said dopant material is diethyl 1-propylphoshonate.

10. The method of claim 1 wherein said dopant material is allylboronic acid pinacol ester.

11. The method of claim 3 wherein said diffusing step comprises using rapid thermal annealing.

12. The method of claim 1 wherein said dilute dopant solution comprises an additional solvent in addition to tetraethylene glycol dimethyl ether.

13. A method of preparing a doped Si surface, comprising:
a) cleaning a Si surface to remove oxides; and
b) contacting the cleaned Si surface with a dilute dopant solution comprising:
   i) at least one solvent selected from the group consisting of tetraethylene glycol dimethyl ether, triethylene glycol dimethyl ether, diethylene glycol dimethyl ether, dimethylsulfoxide, dimethylsulfone, N-methylpyrrolidone, 1 formyl piperidine, Isopar M, ethanolamine, diethanolamine, triethanolamine, linoleic acid, oleic acid, palmitoleic acid, safflower oil, grape seed oil, poppyseed oil, sunflower oil, hemp oil, corn oil, wheat germ oil, cottonseed oil, soybean oil, walnut oil, sesame oil, rice bran oil, pistachio oil, peanut oil, canola oil, chicken fat, egg yolk, linseed oil, lard, olive oil, palm oil, cocoa butter, macadamia oil, butter, and coconut oil; and
   ii) a dopant material effective for doping a Si surface,
wherein said contacting is for a time and at a temperature effective to form a layer of dopant material on the surface.

14. The method of claim 13 wherein said dopant material is a member selected from the group consisting of 5-5-dimethyl-1,3,2-dioxaphosphorinan-2-one, triphenylphosphate, trimethylphosphite, diethyl ethylphosphonate, dimethyl methylphosphonate, diethyl (2-oxobutyl) phosphonate, diethyl (hydroxymethyl)phosphonate, dimethyl (3-phenoxyacetonyl)phosphonate, bis(4-methoxyphenyl)phosphine, bis (3,5-dimethylphenyl)phosphine, diethyl (2-oxopropyl)phosphonate, diethyl 1-phenylethyl phosphonate, diethyl 2-phenylethyl phosphonate, diethyl cyclopropylmethyl phosphonate, dimethyl (3-phenoxyacetonyl)phosphonate, diethyl (2-methylallyl)phosphonate, and Diethyl-1-propylphosphonate.

15. The method of claim 13 wherein the method further includes the step of applying a capping layer to the doped area.

16. The method of claim 15 wherein the method further includes the step of diffusing the dopant into the Si surface by annealing the treated Si substrate.

17. The method of claim 13 wherein said cleaning step comprises contacting the Si surface with dilute HF.

18. The method of claim 13 wherein the method additionally includes the step of treating the cleaned Si surface with 3-methyl-3-methoxybutanol prior to contacting with the dilute dopant solution.

19. The method of claim 13 wherein said solvent is tetraethylene glycol dimethyl ether.

20. The method of claim 13 wherein said solvent includes tetraethylene glycol dimethyl ether and a secondary solvent selected from the group consisting of triethylene glycol dimethyl ether, diethylene glycol dimethyl ether, dimethylsulfoxide, dimethylsulfone, N-methylpyrrolidone, 1 formyl piperidine, Isopar M, ethanolamine, diethanolamine, triethanolamine, linoleic acid, oleic acid, palmitoleic acid, safflower oil, grape seed oil, poppyseed oil, sunflower oil, hemp oil, corn oil, wheat germ oil, cottonseed oil, soybean oil, walnut oil, sesame oil, rice bran oil, pistachio oil, peanut oil, canola oil, chicken fat, egg yolk, linseed oil, lard, olive oil, palm oil, cocoa butter, macadamia oil, butter, and coconut oil.

21. The method of claim 13 wherein said dopant material is provided in an amount of between 1% and 20%.

22. The method of claim 13 wherein said dopant material is provided in an amount of 4% or less.

23. The method of claim 13 wherein said dopant material is diethyl 1-propylphoshonate.

24. The method of claim 13 wherein said dopant material is allylboronic acid pinacol ester.

25. The method of claim 16 wherein said diffusing step comprises using rapid thermal annealing.

\* \* \* \* \*